United States Patent [19]

Schäfer et al.

[11] Patent Number: 5,727,022
[45] Date of Patent: Mar. 10, 1998

[54] METHOD FOR IMPROVING THE SIGNAL-TO-NOISE RATIO IN A TRANSMISSION SYSTEM BY THE FORMATION OF AREA EQUIVALENTS

[75] Inventors: Gerhard Schäfer, Weinsberg; Bernd Memmler, Rosengarten-Rieden, both of Germany

[73] Assignee: Temic Telefunken Microelectronic GmbH, Heilbronn, Germany

[21] Appl. No.: 508,185

[22] Filed: Jul. 27, 1995

[30] Foreign Application Priority Data

Aug. 8, 1994 [DE] Germany .............. 44 27 885.3

[51] Int. Cl.$^6$ .................................................. H03K 9/08
[52] U.S. Cl. .................... 375/238; 375/285; 375/346
[58] Field of Search ....................... 375/238, 239, 375/340; 329/311, 312, 313, 285, 346

[56] References Cited

U.S. PATENT DOCUMENTS

| | | | |
|---|---|---|---|
| 3,281,806 | 10/1966 | Lawrence et al. | 375/238 |
| 3,806,656 | 4/1974 | Tarel | 375/360 |
| 3,939,304 | 2/1976 | Ribes | 375/238 |

FOREIGN PATENT DOCUMENTS

| | | |
|---|---|---|
| 1192238 | 5/1965 | Germany . |
| 1207958 | 12/1965 | Germany . |
| 1549642 | 7/1972 | Germany . |
| 2428370 | 11/1975 | Germany . |
| 25 25 533 | 12/1976 | Germany . |
| 22 59 234 | 3/1978 | Germany . |
| 3107537 | 3/1982 | Germany . |
| 3733966 | 4/1989 | Germany . |
| 3425335 | 12/1989 | Germany . |

OTHER PUBLICATIONS

Söder, G.; Tröndle, K.: "Theorie, Optimierung und Dimensionierung der Basisbandsystems", Digitale Übertragungssystems, Springer–Verlag 1985; pp. 98–106.
Abstract of Soviet Union (SU) Patent No. 420085 Aug. 1974.

Primary Examiner—Stephen Chin
Assistant Examiner—Jeffrey W. Gluck
Attorney, Agent, or Firm—Spencer & Frank

[57] ABSTRACT

The invention relates to a method for associating an information unit from a limited set of various/different information units with a signal sector of given length of a data signal transmitted in a signal transmission system and including superimposed disturbances. The transmission of data takes place by a time-succession of the information units in the data signal. The various information units are coded in each case by a typical curve of the data signal in the corresponding signal sector. On the receiver side of the signal transmission system, different partial areas are determined for each signal sector under the curve of the received data signal. The various partial areas are assigned to rating numbers in accordance with their size. Based on the rating numbers, the decision is made as to which information unit has been transmitted in the relevant signal sector.

8 Claims, 7 Drawing Sheets

METHOD FOR IMPROVING THE SIGNAL-TO-NOISE RATIO IN A TRANSMISSION SYSTEM BY THE FORMATION OF AREA EQUIVALENTS

BACKGROUND OF THE INVENTION

The invention relates to a method whereby the signal-to-noise ratio in transmission systems is improved when the information is mapped by defined signal curves.

When transmitting information, defined signal curves can be used to encode various information units. For instance, the information units 0 and 1 of digital signals can be converted into a pulse-length-modulated high-frequency signal. The blanking intervals for the two information units are selected and transmitted differently. Also, information can be transmitted with a character set of more than two information elements. If disturbances occur, restoration of such transmitted signals can be erroneous or even impossible. Methods that allow certain recognition of the information units in spite of the presence of disturbances are therefore of particular significance. This is especially the case when successful reception of the signals is not possible without such methods.

In the transmission of signals by defined lifting and lowering of the carrier amplitude in an HF signal, characteristic signal curves result on the receiver side of the transmission system that can be adopted for reconstructing the original square-wave signals. Known methods make use of threshold values detected, for example, by a Schmitt trigger that reconstructs a square-wave signal corresponding to the length of the dip in the carrier. If noise occurs, there is a risk of the set threshold values not being reached, or only after a period of time containing errors. The reconstruction of the original signal therefore also includes errors.

SUMMARY OF THE INVENTION

In the case of disturbances that do not completely falsify the signal as such, recognition of the information units is to be expected when an improved method is used. The object of the invention is, therefore, to describe a method that allows information units to be associated with a data signal described above even if considerable disturbances occur. This object is solved by a method in which, on the receiver side of a signal transmission system, different partial areas are determined for each signal sector under the curve of the received data signal, the various partial areas are assigned to rating numbers in accordance with their size and, based on the rating numbers, a decision is made as to which information unit has been transmitted in the relevant signal sector.

BRIEF DESCRIPTION OF THE DRAWINGS

An embodiment example of the invention will now be described in more detail on the basis of the drawings.

DESCRIPTION OF THE PREFERRED EMBODIMENTS

Figure 1:
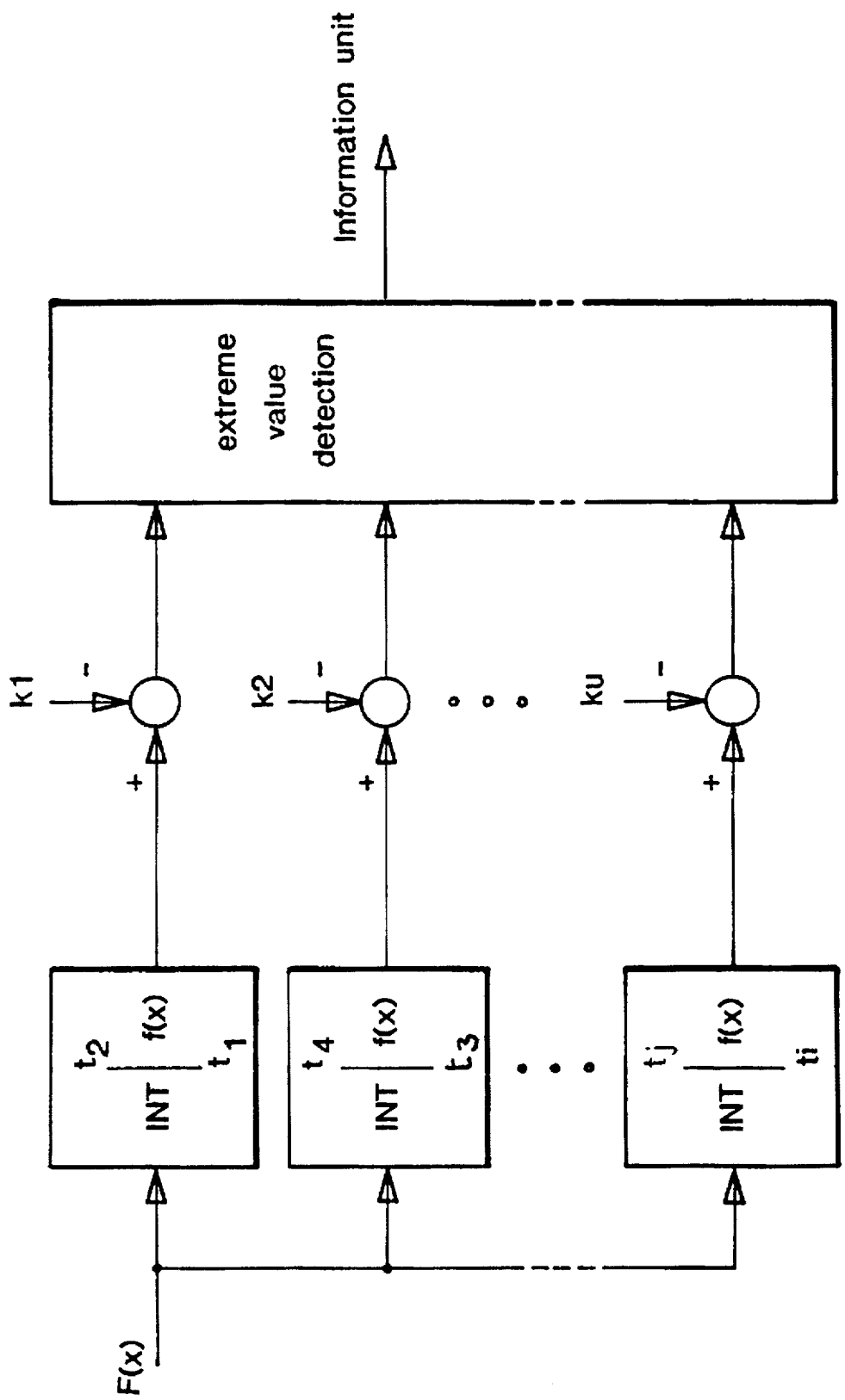
FIG. 1 is a block diagram for use in explaining the method of the present invention.

The method presented here uses area equivalents under the signal curve within a certain time interval to determine which information unit is involved. If several different information units are to be detected, an interval $T_i$ [$t_i, t_j$] can be specified for each associated curve with $t_i < t_j$, and for which an area equivalent is determined. The initial and end times $t_i$ and $t_j$ which represent the start and stop times for determining the areas must be determined in advance for the various signal curves of the information units. The area equivalent is defined as $$INT = \left| \int_{t_i}^{t_j} f(x) \right|$$

and can be formed, for example, as the integral or discrete-time sum of the received signal $F(x)$ in the interval $T_i$ [$t_i, t_j$]. An extreme value viewing function determines which information unit is recognized. To eliminate constant components, manipulation of the established area equivalent is possible by subtracting a constant value, but this is not essential. The evaluation process is started once at a specific moment of time or it is started continually at given intervals. The detected information unit is output for further processing. For detection, a time interval is awaited, and the output value is processed further after a predetermined period of time. FIG. 1 shows a sequence of integrated or summed intervals, one of which will result in an area equivalent that is larger than the rest and thus permit identification of the transmitted information unit, and FIGS. 2A–2C (which will be discussed in more detail later) show received waveforms for various information units with area equivalents which result when they are integrated or summed during their respective intervals.

Disturbances outside of the time intervals are masked out and have no further effect on the method. Disturbances within the time intervals are for the most part masked out by the area formation: if a disturbance supplies just as many area equivalents with negative function values as with positive function values, the actual equivalent signal area is not affected. The boundaries of the method are to be found with disturbance curves which, for example, completely eliminate the signal or are of such a magnitude that the component of the area equivalent of the actual signal is small compared with the area equivalent of the disturbance.

The manner in which the method works will now be demonstrated by considering as an example a time-signal receiver. The time-signal transmitter is to send out a long-wave signal whose carrier frequency is reduced in the seconds clock cycle to 25% of the normal amplitude. The information units are coded by means of the length of the seconds pulses. Three lengths are provided for the seconds pulses, namely 200 ms, 500 ms and 800 ms. The specified times correspond in each case to the time taken for the carrier amplitude to drop to 25% of the initial value.

Figure 3:
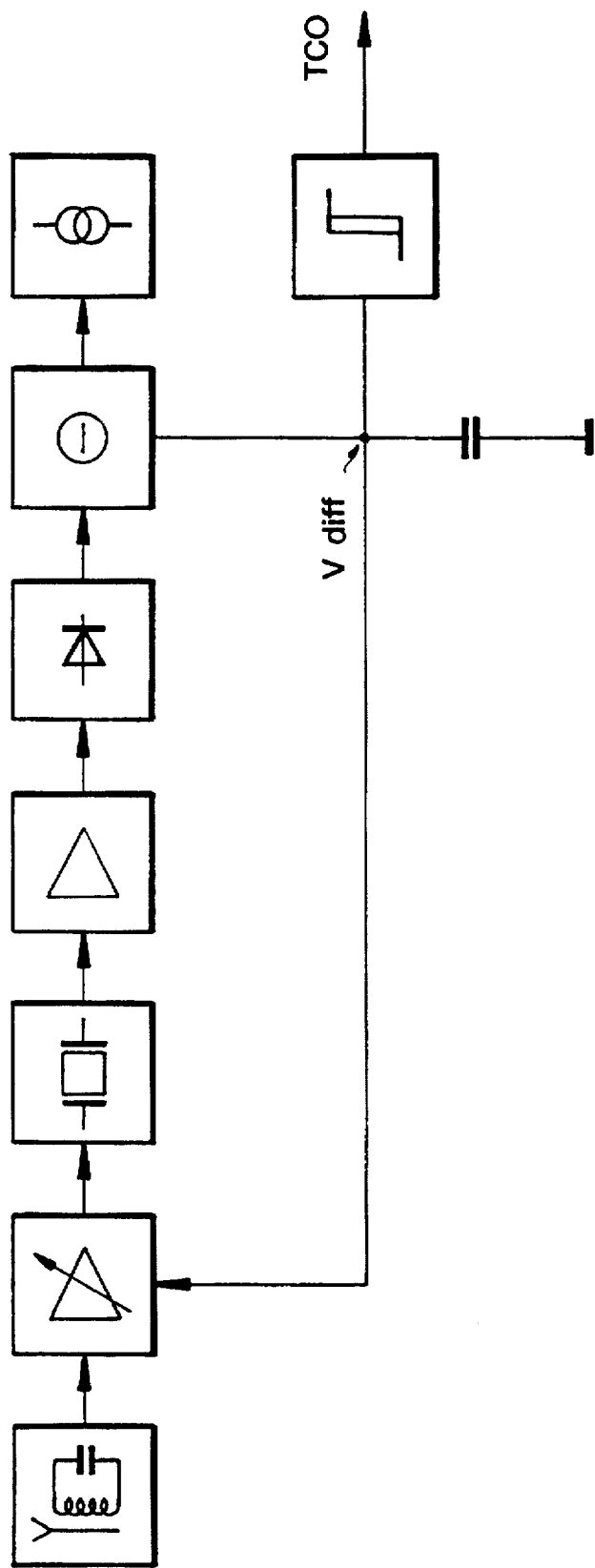
FIG. 3 is a block diagram for a state-of-the-art radio-controlled clock receiver.

FIG. 3 shows a radio-controlled clock receiver as described, for example, in German Patent 35 16 810 and which is applied successfully in practice. It comprises an input circuit with antenna, an automatic gain control amplifier, a filter tuned to the frequency of the transmitter, another amplifier stage, a rectifier and a differential amplifier that compares the input signal with a constant reference. The differential voltage is accumulated through a capacitor and supplied to the automatic gain control amplifier as a control signal. At the same time, the square-wave signal is reconstructed from the control signal.

Figure 4:
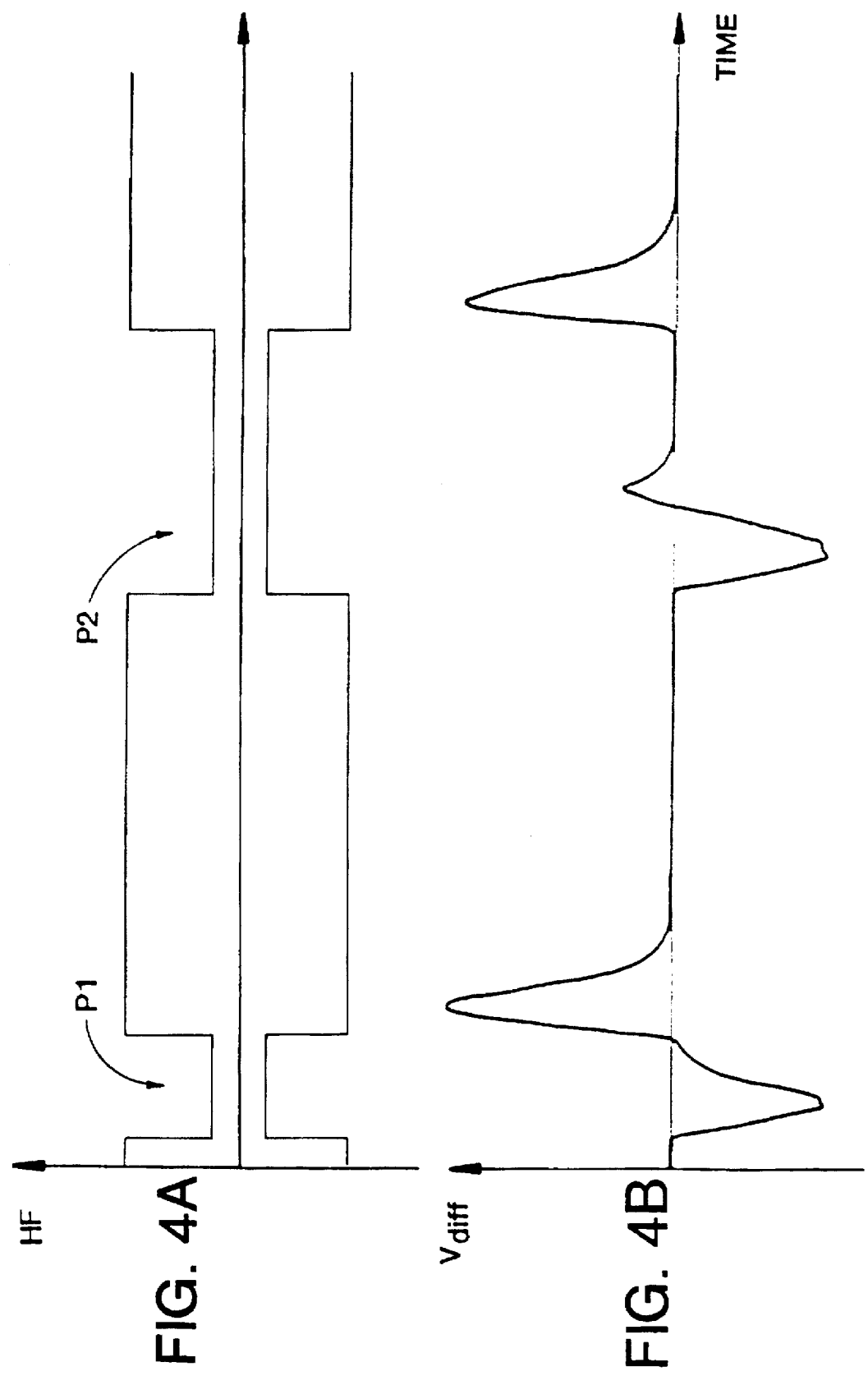
FIGS. 4A and 4B are graphs respectively showing an ideal high-frequency signal and the output signal provided by the radio-controlled clock receiver.

FIG. 4A shows the HF signal of a time signal transmitter with two seconds pulses P1 and P2. The first pulse has a length of 200 ms and the second pulse P2 has a length of 500 ms. The associated signal curve as typically presented for evaluation in a radio-controlled clock receiver is shown in FIG. 4B.

Figure 5:
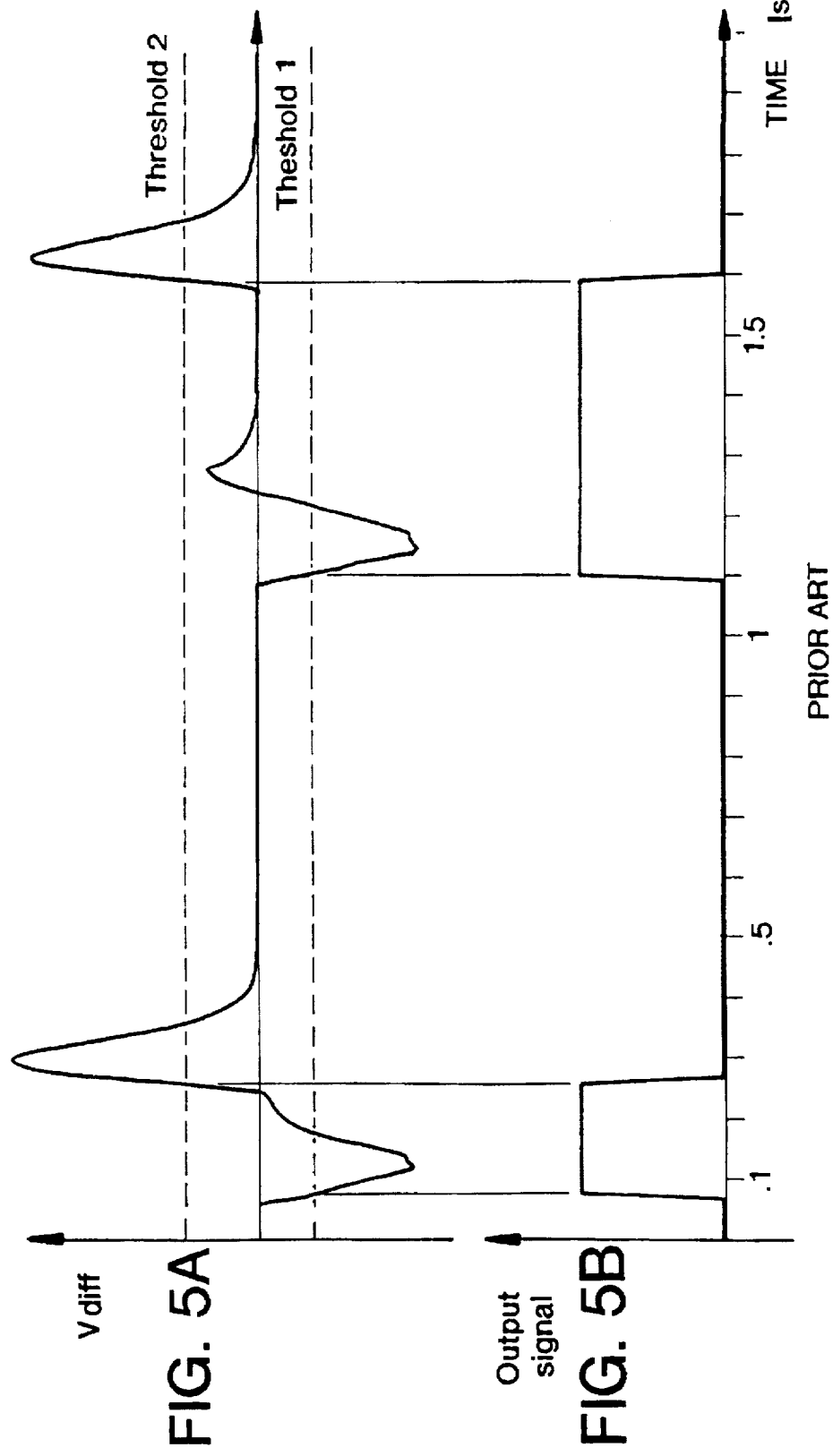
FIGS. 5A and 5B show how the threshold method functions in accordance with the state of the art.

FIGS. 5A and 5B show the known method for determining the pulse length with the help of threshold values. It can easily be seen that disturbances superimposed on the signal quickly lead to erroneous results.

Figure 6:
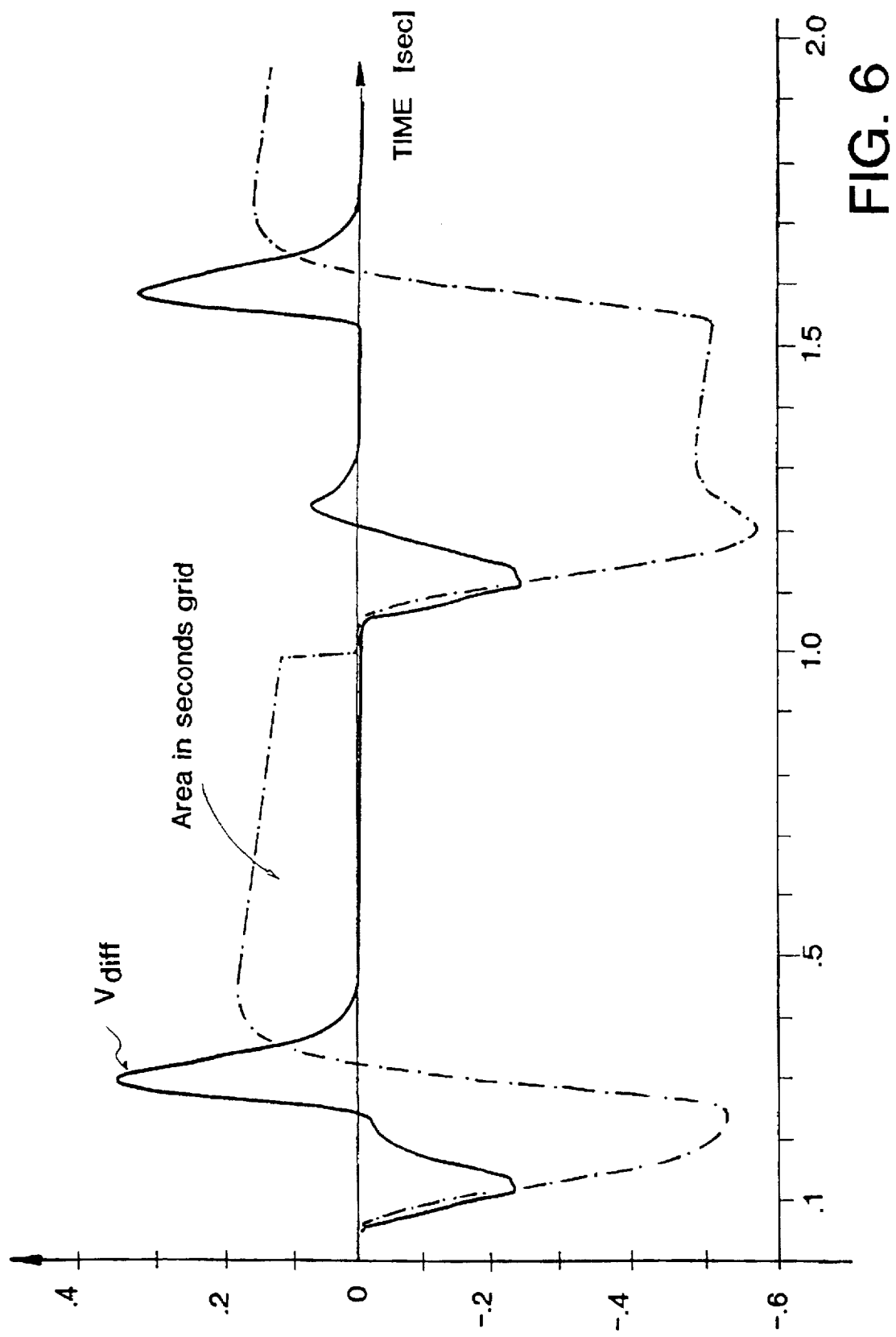
FIG. 6 shows the output signal of the radio-controlled clock receiver together with the area equivalents.

The result of area summation for the same signal curve is shown in FIG. 6. The different curves for the two signal pulses of different length can be seen clearly. This property is exploited by the method for forming area equivalents. Each time a pulse begins, different area equivalents are formed, each of which delivers a maximum value for a specific information unit. The time limits of the summation interval are selected accordingly. The integration causes disturbances that have the same areas in the positive and in the negative direction to be completely masked out.

Figure 2:
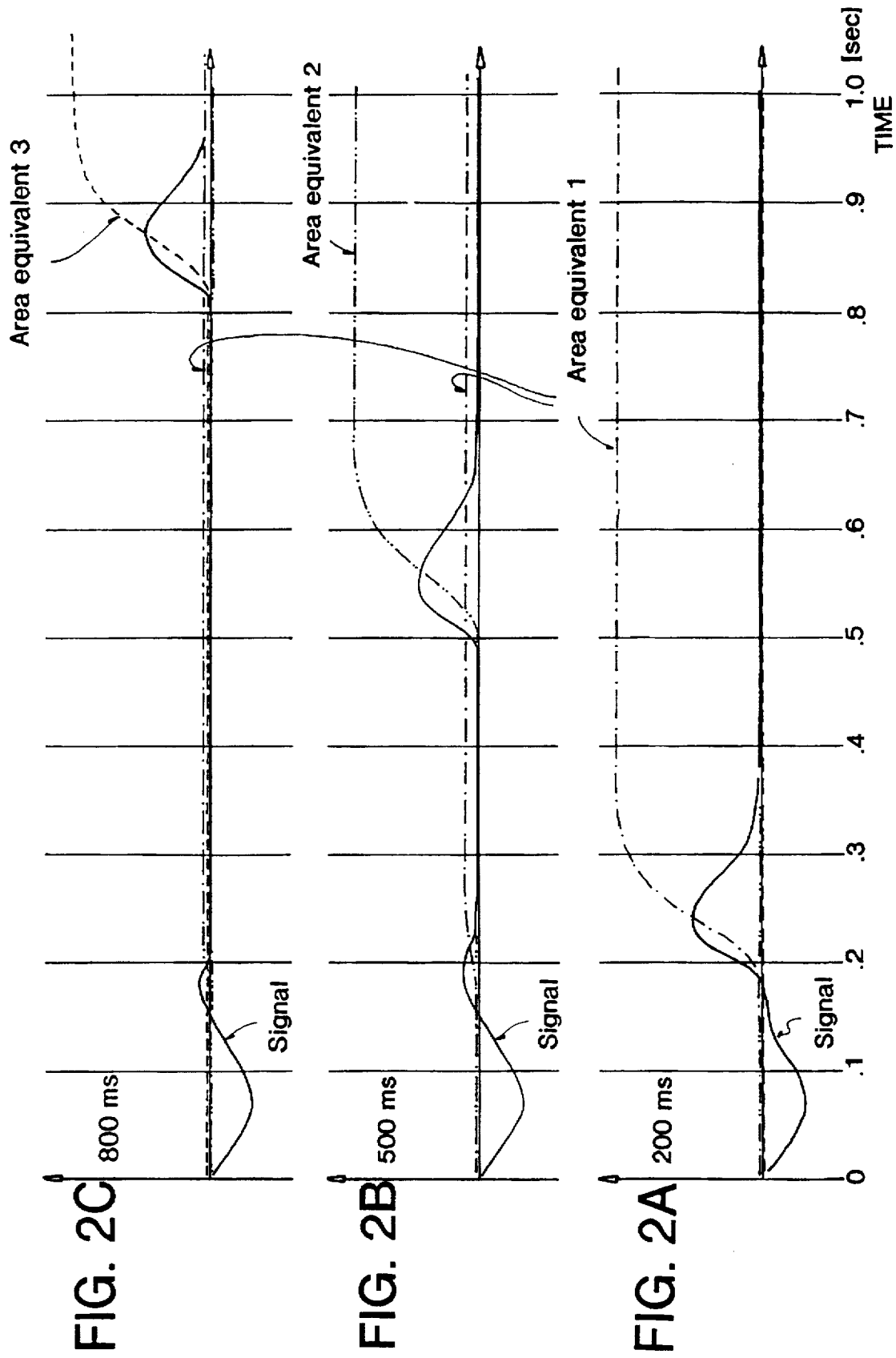
FIGS. 2A, 2B and 2C show diagrams for forming area equivalents for three different information units.

FIG. 2 shows the curves for the area equivalents once again. For the sake of better clarity, the three information units (200 ms, 500 ms, 800 ms) of the time signal are shown in such a manner as though they were running concurrently. The pulses each begin at 0 and end after a given time. If the time intervals $T_i$ [$t_i, t_j$] for the three concurrently running area sums are now selected such that in essence the rising signal edge is registered at the end of the blanking intervals, the transmitted information unit can be recognized by the maximum of the three areas formed. That is, the area equivalents that result when the received signal is integrated or summed during the different time intervals can be assigned to rating numbers in accordance with their size, so that a decision can be made as to which information was transmitted on the basis of the rating numbers.

Figure 7:
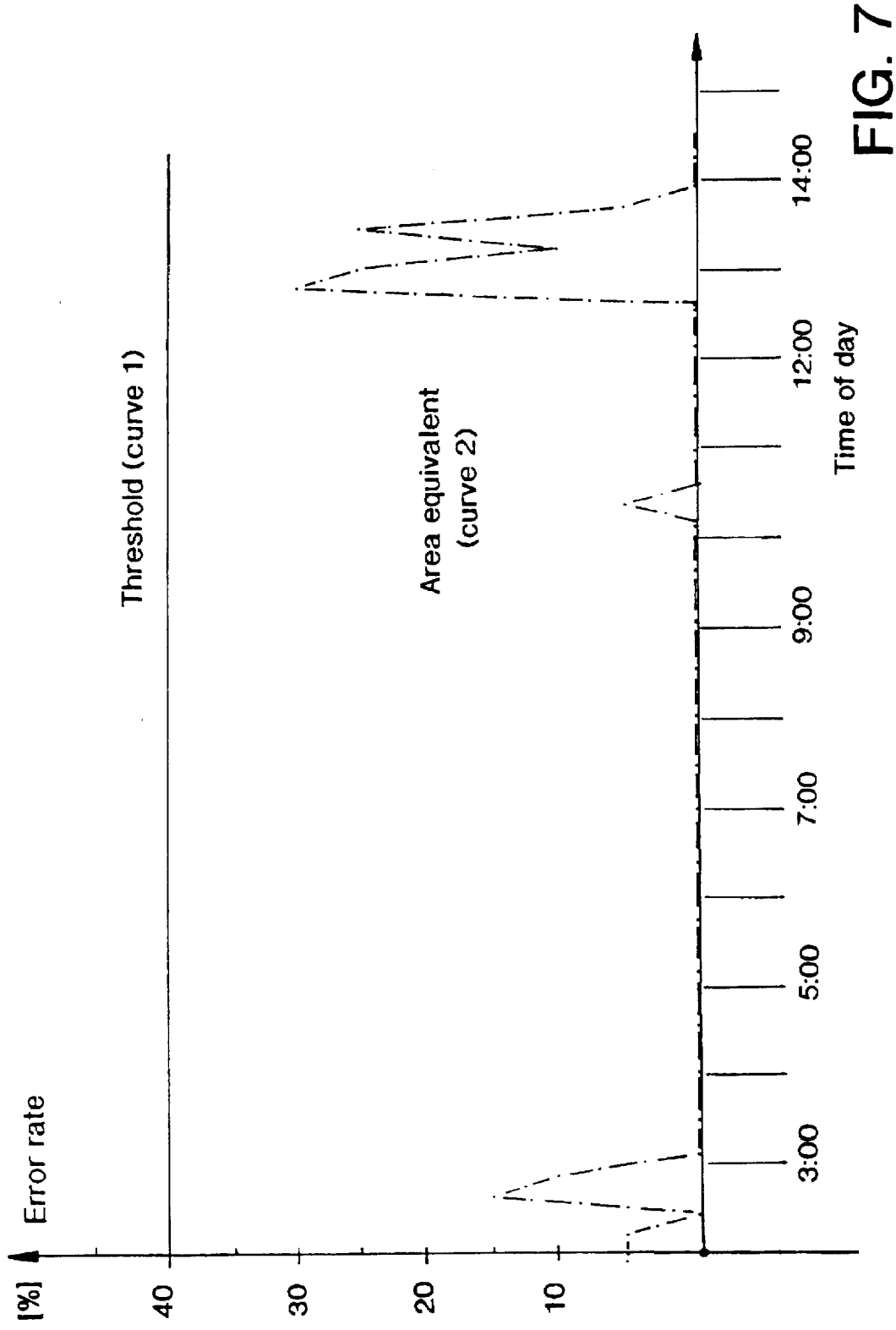
FIG. 7 shows a comparison of the error rates of a radio-controlled clock receiver in accordance with the state of the art and a receiver with the new evaluation method.

FIG. 7 shows a diagram in which the error rate of a conventional radio-controlled clock receiver is compared with the error rate of a radio-controlled clock receiver that operates with the detection method corresponding to the method described here. The two radio-controlled clock receivers were synchronized with the time signal every 15 minutes in a moderately disturbed environment from 2 a.m. to 2 p.m. Whereas the conventional receiver produced a consistent error rate of 40%, the error rate for the receiver operating in accordance with the area equivalents method was 0% for most of the time.

What is claimed is:

1. A method for associating an information unit from a limited set of various/different information units with a signal sector of given length of a data signal transmitted in a signal transmission system that is susceptible to superimposed disturbances, where the transmission of data takes place by a time-succession of the information units in the data signal and the various information units are coded in each case by a typical curve of the data signal in the corresponding signal sector, the method comprising the steps of:

on the receiver side of the signal transmission system, determining different partial areas for each signal sector under the curve of the received data signal;

on the receiver side of the signal transmission system, determining the beginning of the individual information units over several signal sectors;

assigning the various partial areas to rating numbers in accordance with their size; and deciding, based on the rating numbers, which information unit has been transmitted in the relevant signal sector.

2. A method in accordance with claim 1, wherein the data signal is pulse-length modulated and an information unit is contained in each signal sector.

3. A method in accordance with claim 2, wherein the pulse length L for the various information units is given by a number n of different discrete pulse lengths $L_i$.

4. A method in accordance with claim 3, wherein for each pulse length $L_i$ that can occur in the data signal f(x), precisely one partial area $INT_i$ is formed per signal sector.

5. A method in accordance with claim 4, wherein the i-th partial area $INT_i$ is obtained by summation or integration of the curve of the data signal in the signal sector in the time interval $T_i$ with a start time point $t_i$ and an end time point $t_j$.

6. A method in accordance with claim 5, wherein the start time points $t_i$ for the i various partial areas $INT_i$ are different.

7. A method in accordance with claim 6, wherein the end time points $t_j$ for the i various partial areas $INT_i$ are different.

8. A method in accordance with claim 5, wherein the end time points $t_j$ for the i various partial areas $INT_i$ are different.

* * * * *